United States Patent
Raschke et al.

(10) Patent No.: US 12,271,110 B2
(45) Date of Patent: Apr. 8, 2025

(54) RETICLE POD HAVING LATCH INCLUDING RAMPED SURFACE

(71) Applicant: ENTEGRIS, INC., Billerica, MA (US)

(72) Inventors: Russ V. Raschke, Chanhassen, MN (US); Caleb Elwell, Manitou Springs, CO (US); Matthew Reber, Chaska, MN (US)

(73) Assignee: ENTEGRIS, INC., Billerica, MA (US)

( * ) Notice: Subject to any disclaimer, the term of this patent is extended or adjusted under 35 U.S.C. 154(b) by 280 days.

(21) Appl. No.: 17/940,517

(22) Filed: Sep. 8, 2022

(65) Prior Publication Data
US 2023/0075744 A1 Mar. 9, 2023

Related U.S. Application Data

(60) Provisional application No. 63/242,305, filed on Sep. 9, 2021.

(51) Int. Cl.
*H01L 21/673* (2006.01)
*G03F 1/66* (2012.01)
*G03F 7/00* (2006.01)

(52) U.S. Cl.
CPC ............ *G03F 1/66* (2013.01); *G03F 7/70741* (2013.01); *G03F 7/70933* (2013.01)

(58) Field of Classification Search
CPC ..... G03F 1/66; G03F 1/64; G03F 1/62; G03F 1/82; G03F 7/70741; G03F 7/70933; B65D 85/38; H01L 21/67386; H01L 21/67353; H01L 21/67369; H01L 21/67373
USPC ................................................ 206/710, 316.1
See application file for complete search history.

(56) References Cited

U.S. PATENT DOCUMENTS

| 4,842,136 A * | 6/1989 | Nakazato .......... H01L 21/67359 220/827 |
| 2010/0108565 A1* | 5/2010 | Lu ..................... H01L 21/67369 206/711 |
| 2011/0155598 A1* | 6/2011 | Lu ............................. G03F 1/66 206/349 |

* cited by examiner

Primary Examiner — King M Chu (57) ABSTRACT

Reticle pods include interfacing surfaces to secure segments of the reticle pod to one another. At least one of the interfacing surfaces is a ramped surface, such that when the reticle pods are secured to one another, the reticle is clamped between reticle contacts provided on the segments of the reticle pod. When the reticle pod is assembled and contains a reticle, a purge gas flow passage can be formed in the reticle pod. The height of the reticle contacts and the thickness of the reticle can be such that the reticle pod segments are spaced apart from one another by a gap, with the gap providing the purge gas flow passage. The reticle pod can be a stocker pod for the transportation and storage of reticles.

18 Claims, 6 Drawing Sheets

RETICLE POD HAVING LATCH INCLUDING RAMPED SURFACE

PRIORITY

This disclosure claims priority to U.S. Provisional Patent No. 63/242,305, filed on Sep. 9, 2021, which is incorporated by reference in its entirety.

FIELD

This disclosure is directed to pods for the storage and/or transportation of reticles, particularly pods including pod segments having interfacing surfaces including ramped surfaces.

BACKGROUND

Reticles typically are transported, processed, and stored in reticle pods which include an inner pod and an outer pod. The inner pod is configured such that it can be used during the processing of the reticles, for example in photolithography such as extreme ultraviolet (EUV) processes. The features of inner pods making them suitable for use in reticle processing such as filters, formation of seals, and/or other features of the inner pods can make the inner pods more complex and expensive, and less suitable for storage of reticles.

SUMMARY

This disclosure is directed to pods for the storage and/or transportation of reticles, particularly pods including pod segments having interfacing surfaces including ramped surfaces.

Reticle pods can use interfacing surfaces including at least one ramped surface to provide clamping force to close the pod and clamp the reticle contained therein. The reticle pods can be held together by the interface of first and second ramped surfaces respectively provided on the first and second segments. The interface of the ramped surfaces can hold the first and second segments together such that they clamp the reticle at reticle contacts provided in each of the first and second segments, such that the reticle is secured within a reticle accommodation space formed within the stocker pod. This can improve the clamping of the reticle, securing the reticle even during movement of the reticle pod or shock events such as the reticle pod being struck or dropped.

The reticle pods can be stocker pods. Stocker pods can allow higher storage density by being less bulky than traditional reticle pods and can have reduced cost by including only features directed to reticle storage, and not features for reticle processing such as filters, sealing of the pods, or the like. The stocker pods can include one or more flow paths that can allow purge gas to flow through the stocker pod to drive out oxygen, water, particulate matter, other contaminants, or the like to protect contained reticles and thus improve overall process yields. The flow path can be a gap between segments of the reticle pod. Multiple reticle pods can be used in a stocker pod container to store a number of reticles, with the stocker pod container providing an environment suitable for the storage of the reticles, for example including flows of purge gas through the stocker pods.

In an embodiment, an article includes a reticle pod. The reticle pod includes a first reticle pod segment, with the first reticle pod including a plurality of first reticle contacts and a plurality of latches, and each of the plurality of latches including a first interface surface. The reticle pod further includes a second reticle pod segment, including a plurality of second reticle contacts and a plurality of second interface surfaces. Each of the first interface surfaces of the plurality of latches is configured to contact one of the plurality of second interface surfaces when the first interface surfaces are in a latching position. One or both of the first interface surfaces and the second interface surfaces are ramped surfaces. The reticle pod is configured to accommodate a reticle in a reticle accommodation space such that when the reticle is within the reticle accommodation space and the first interface surfaces contact the second interface surfaces, the reticle is clamped by the plurality of first reticle contacts and the plurality of second reticle contacts.

In an embodiment, when the reticle is contacted by the plurality of first reticle contacts and the plurality of second reticle contacts, the reticle pod defines a purge gas flow path from an exterior of the reticle pad through the reticle space. In an embodiment, the purge gas flow path is formed by a gap between the first reticle pod segment and the second reticle pod segment. In an embodiment, the gap is in the range from 0.5 to 6 millimeters (mm). In an embodiment, the gap is formed by heights of each of the plurality of first reticle contacts and the plurality of second reticle contacts and a thickness of the reticle.

In an embodiment, at least one of the first reticle pod segment and the second reticle pod segment includes a plurality of reticle contact bosses, and wherein at least some of the first plurality of reticle contacts or at least some of the second plurality of reticle contacts are partially disposed in the plurality of reticle contact bosses.

In an embodiment, the plurality of first reticle contacts and the plurality of second reticle contacts include a polyether ether ketone (PEEK) material.

In an embodiment, at least one of the first reticle pod segment and the second reticle pod segment includes aluminum.

In an embodiment, both the first interface surfaces and the second interface surfaces are ramped surfaces.

In an embodiment, each of the second interface surfaces is disposed on an outer surface of the second reticle pod segment. In an embodiment, an opening is provided on the second reticle pod segment, the opening configured to allow a portion of the latching member body including the first interface surface to pass through said opening, and wherein the opening is positioned adjacent to each of the second interface surfaces.

In an embodiment, each of the second interface surfaces is disposed on a flange, each flange projecting towards the first reticle pod segment when the reticle pod is assembled.

In an embodiment, each of the latches includes a channel, a latching member body configured to be movable within the channel, the latching member body including one of the plurality of first interface surfaces, and a spring, the spring configured to drive the latching member body along the channel such that the latching member body is driven towards the latching position. In an embodiment, an angle of each of the first interface surfaces and each of the second interface surfaces and a coefficient of friction of each of the first interface surfaces and each of the second interface surfaces are selected such that the latch main body resists backing out of the latching position when the first interface surfaces contact the second interface surfaces. In an embodiment, an angle of each of the first interface surfaces and each of the second interface surfaces is 30° or less.

In an embodiment, a method of storing a reticle includes placing the reticle into a reticle pod. The reticle pod includes a first reticle pod segment, with the first reticle pod including a plurality of first reticle contacts and a plurality of latches, and each of the plurality of latches including a first interface surface. The reticle pod further includes a second reticle pod segment, including a plurality of second reticle contacts and a plurality of second interface surfaces. Each of the first interface surfaces of the plurality of latches is configured to contact one of the plurality of second interface surfaces when the first interface surfaces are in a latching position. One or both of the first interface surfaces and the second interface surfaces are ramped surfaces. The reticle pod is configured to accommodate a reticle in a reticle accommodation space such that when the reticle is within the reticle accommodation space and the first interface surfaces contact the second interface surfaces, the reticle is clamped by the plurality of first reticle contacts and the plurality of second reticle contacts.

In an embodiment, when the reticle is contacted by the plurality of first reticle contacts and the plurality of second reticle contacts, the reticle pod defines a purge gas flow path from an exterior of the reticle pad through the reticle space, and wherein the method further comprises providing a purge gas flow through the purge gas flow path.

In an embodiment, each of the latches includes a channel, a latching member body configured to be movable within the channel, the latching member body including one of the plurality of first interface surfaces, and a spring, the spring configured to drive the latching member body along the channel such that the latching member body is driven towards the latching position. Placing the reticle into the article includes drawing each of the latching member bodies into an unlatching position, bringing the first reticle pod segment and the second reticle pod segment together such that the reticle is contacted by the plurality of first reticle contacts and the plurality of second reticle contacts, and releasing each of the latching member bodies such that the springs can drive the latching member bodies to the latching position.

In an embodiment, a reticle storage system includes a pod container, a purge gas supply, and a plurality of reticle pods each configured to be contained within the pod container. Each reticle pod includes a first reticle pod segment, with the first reticle pod including a plurality of first reticle contacts and a plurality of latches, and each of the plurality of latches including a first interface surface. The reticle pod further includes a second reticle pod segment, including a plurality of second reticle contacts and a plurality of second interface surfaces. Each of the first interface surfaces of the plurality of latches is configured to contact one of the plurality of second interface surfaces when the first interface surfaces are in a latching position. One or both of the first interface surfaces and the second interface surfaces are ramped surfaces. The reticle pod is configured to accommodate a reticle in a reticle accommodation space such that when the reticle is within the reticle accommodation space and the first interface surfaces contact the second interface surfaces, the reticle is clamped by the plurality of first reticle contacts and the plurality of second reticle contacts.

DETAILED DESCRIPTION

This disclosure is directed to pods for the storage and/or transportation of reticles, particularly pods including pod segments having interfacing surfaces including ramped surfaces.

Figure 1:
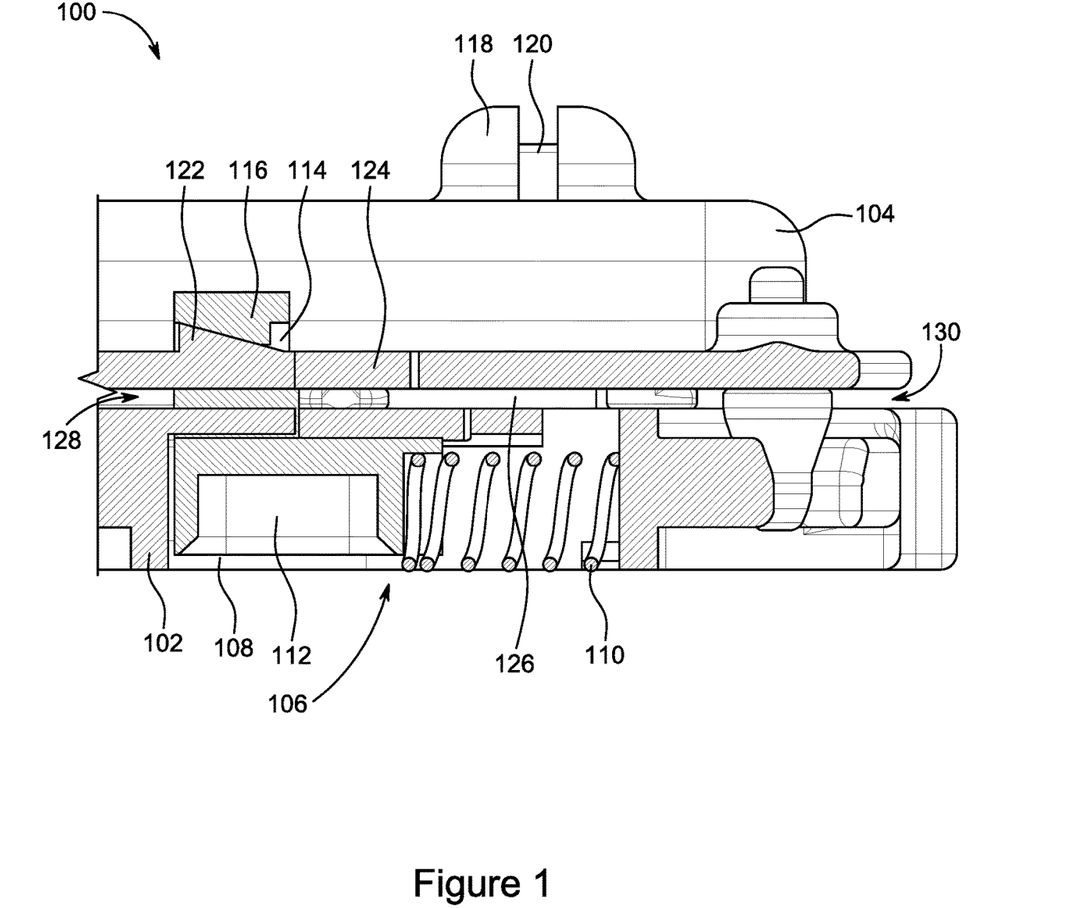
FIG. 1 shows a sectional view of a reticle pod according to an embodiment.

FIG. 1 shows a sectional view of a reticle pod according to an embodiment. reticle pod 100 includes first reticle pod segment 102 and second reticle pod segment 104. First reticle pod segment 102 includes a latch 106. Latch 106 includes a channel 108, a spring 110, and latch main body 112. Latch main body 112 includes a flange 114 and a first interface surface 116. Second reticle pod segment 104 includes a boss 118 and a reticle contact 120. Second reticle pod segment 104 further includes a second interface surface 122. Second reticle pod segment 104 can include an opening 124 located near or adjacent to the second interface surface 122. A reticle 126 can be contained in reticle accommodation space 128 formed by the first reticle pod segment 102 and the second reticle pod segment 104. A gap 130 can be formed between the first reticle pod segment 102 and the second reticle pod segment 104.

Reticle pod 100 is a pod for storage of a reticle such as reticle 126. The reticle pod 100 can be one of a plurality of stocker pods included in a reticle storage system, as described below and shown in FIG. 5. In an embodiment, the reticle pod 100 does not form a seal when the reticle 126 is contained within the reticle pod 100. In an embodiment, reticle pod 100 does not include filters or other such features that can be included in reticle pods used in reticle processing such as photolithography including, as a non-limiting example, extreme ultraviolet (EUV) processing. In an embodiment, reticle pod 100 includes a filter and/or any other suitable features for a pod used in processing of reticles.

First reticle pod segment 102 is a segment of reticle pod 100 that is configured to define the reticle accommodation space 128 when joined to second reticle pod segment 104. In an embodiment, first reticle pod segment 102 forms a lower portion of reticle pod 100, serving as a baseplate of reticle pod 100. In an embodiment, first reticle pod segment 102 forms an upper portion of reticle pod 100, serving as a cover in reticle pod 100. In an embodiment, the first reticle pod segment 102 can be made primarily of aluminum.

Latch 106 provides first interface surface 116 such that first interface surface 116 can contact a second interface surface 122 provided on the second reticle pod segment 104. The latch 106 can further be configured to allow first interface surface 116 to be moved from a latching position to an unlatching position. In the latching position, first interface surface 116 contacts second interface surface 122. In the unlatching position, the first interface surface 116 and the second interface surface 122 are not in contact. In an embodiment, the unlatching position can further include positioning the first interface surface 116 such that the first reticle pod segment 102 and the second reticle pod segment 104 can be separated from one another, for example by positioning first interface surface 116 such that it can pass through opening 124.

In an embodiment, latch 106 includes a channel 108. Channel 108 can be sized to accommodate at least a portion of latch main body 112. In an embodiment, channel 108 is oriented with a major direction in plane with a plane of the first reticle pod segment 102. In an embodiment, channel 108 includes a slot through which flange 114 can extend towards the second reticle pod segment 104. Spring 110 can be disposed within channel 108, the spring 110 contacting an end of the channel 108 and latch main body 112. In an embodiment, latch 106 includes a latch main body 112. The latch main body 112 can be configured such that it can be retained within channel 108 such that the latch main body can be driven along channel 108 by force from spring 110. The latch main body 112 can include a flange 114, which extends out from channel 108 to place first interface surface 116 in a position to contact the second interface surface 122.

Latch 106 includes a first interface surface 116. First interface surface 116 is an angled surface configured to contact a corresponding second interface surface 122. While only one first interface surface 116 is shown in FIG. 1, a plurality of first interface surfaces 116 can be provided on first reticle pod segment 102. In an embodiment, each first interface surface 116 can be provided on a separate latch 106. In an embodiment, the plurality of first interface surfaces 116 can be distributed around a perimeter of the first reticle pod segment 102. In an embodiment, the plurality of first interface surfaces 116 can be provided on opposing sides of the first reticle pod segment 102. The latches 106 can be positioned and oriented such that actuation of the latches produces reduced or no shifting of the first reticle pod segment 102 to the second reticle pod segment 104. The first interface surface 116 can be shaped and positioned such that at least a portion of first interface surface 116 contacts at least a portion of the second interface surface 122 when first reticle pod segment 102 and second reticle pod segment 104 surround reticle 126 and the first interface surface 116 is in the latching position. In an embodiment, the first interface surfaces 116 are ramped surfaces, for example as shown in FIG. 1. In an embodiment, the first interface surfaces 116 can have a shape other than a ramped surface, for example, a flat surface, a rounded surface, a pin, or the like, when the second interface surfaces 122 are ramped surfaces. In an embodiment, the first interface surfaces 116 and the second interface surfaces 122 are each complementary ramped surfaces. The contact of the first interface surface 116 and the second interface surface 122 can provide force pushing first reticle pod segment 102 and second reticle pod segment 104 towards one another, providing clamping force to the reticle 126 contained within reticle pod 100.

Second reticle pod segment 104 is a segment of reticle pod 100 that is configured to define the reticle accommodation space 128 when joined to first reticle pod segment 102. In an embodiment, second reticle pod segment 104 forms an upper portion of reticle pod 100, serving as a cover in reticle pod 100. In an embodiment, second reticle pod segment 104 forms a lower portion of reticle pod 100, serving as a baseplate of reticle pod 100. In an embodiment, the second reticle pod segment 104 can be made primarily of aluminum.

Boss 118 can be formed in second reticle pod segment 104. Additional bosses 118 can be formed in portions of the second reticle pod segment 104 not visible in the view of FIG. 1. In an embodiment, a boss 118 is provided for each reticle contact 120 included in second reticle pod segment 104. The bosses 118 can each include one or more mechanical features for securing the reticle contact 120. The mechanical features can include, as a non-limiting example, a channel into which the reticle contact 120 can be press-fit. It is understood that any suitable mechanical connection can be used to retain reticle contacts 120, with each boss 118 including the corresponding features. In an embodiment, instead of bosses 118, the reticle contacts 120 can be contained within features formed in the first reticle pod segment 102 and the second reticle pod segment 104, such as drilled holes or the like. It is understood that while FIG. 1 shows boss 118 on second reticle pod segment 104, embodiments can include bosses such as boss 118 on first reticle pod segment 102 in addition to or in place of the bosses being formed on the second reticle pod segment 104.

Reticle contact 120 is configured to contact reticle 126 when the reticle pod 100 is assembled. The reticle contact 120 can be secured within boss 118 by any suitable mechanical connection, such as, as a non-limiting example, a press-fit. Reticle contact 120 can be one of a plurality of reticle contacts provided on both the first reticle pod segment 102 and the second reticle pod segment 104. When reticle pod 100 is assembled, at least some of the plurality of reticle contacts clamp the reticle 126 to secure reticle 126 within the reticle accommodation space 128. Reticle contact 120 can be made of any suitable material for contacting reticle 126. As a non-limiting example, reticle contact 120 can include a polyether ether ketone (PEEK) material, such as pure PEEK or PEEK including a filler such as carbon or glass fibers. Reticle contacts including reticle contact 120 can be sized such that when a reticle 126 is clamped by the reticle contacts, the first reticle pod segment 102 and second reticle pod segment 104 can be held apart from one another, forming a gap 130.

Second interface surface 122 is an interface surface that is configured to contact the first interface surface 116. In an embodiment, the second interface surfaces 122 can have a shape other than a ramped surface, for example, a flat surface, a rounded surface, a pin, or the like, when the first interface surfaces 116 are ramped surfaces. In an embodiment, the first interface surfaces 116 and the second interface surfaces 122 are each complementary ramped surfaces. Second interface surface 122 can be in a fixed position on second reticle pod segment 104. In an embodiment, second interface surface 122 projects directly from second reticle pod segment 104. In an embodiment, the second interface surface 122 is formed of the same material as the body of second reticle pod segment 104. Second interface surface 122 can be shaped and positioned such that at least a portion of second interface surface 122 contacts at least a portion of the first interface surface 116 when first reticle pod segment 102 and second reticle pod segment 104 surround reticle 126 and the first interface surface 116 is in a latching position. In an embodiment, second interface surface 122 has an angle that is the same as the angle of first interface surface 116.

In an embodiment, the angles of first interface surface 116 and second interface surface 122 can be selected based on the coefficient of friction of the contacting surfaces of first interface surface 116 and second interface surface 122 to limit or prevent the first interface surface from backing out of the latching position. In an embodiment, the angles of the ramped surfaces of the first interface surface 116 and/or the second interface surface 122 can be 30° or less. In an embodiment, the angles of the ramped surfaces of the first interface surface 116 and/or the second interface surface 122 can be 20° or less. In an embodiment, the angles of the ramped surfaces of the first interface surface 116 and/or the second interface surface 122 can be 15° or less.

Opening 124 is an opening formed in the second reticle pod segment 104 that is sized such that an end of flange 114 including first interface surface 116 can pass through the opening 124 when the first interface surface 116 is in an unlatching position. The opening 124 can be positioned adjacent to or near second interface surface 122 such that the first interface surface 116 and the second interface surface 122 can contact one another when the first interface surface 116 is in the latching position, for example when latch main body 112 is driven along channel 108 by spring 110. In an embodiment, opening 124 can be omitted and flange 114 can extend upwards outside a perimeter of second reticle pod segment 104 with first interface surface 116 disposed on flange 114 such that it can still contact second interface surface 122.

Reticle 126 is a reticle that can be stored within the reticle pod 100. The reticle 126 can be any suitable reticle, such as a reticle that has been or will be subjected to photolithography, such as an EUV process. The reticle 126 can be sized such that it fits within reticle accommodation space 128. In an embodiment, a thickness of the reticle 126 can be such that first reticle pod segment 102 and the second reticle pod segment 104 are spaced apart from one another to form the gap 130 when the reticle 126 is clamped between the reticle contacts including reticle contact 120 provided on the first reticle pod segment 102 and the second reticle pod segment 104.

Reticle accommodation space 128 can be defined by the first reticle pod segment 102 and the second reticle pod segment 104. The reticle accommodation space can be sized such that the reticle 126 can be clamped between the reticle contacts, including reticle contact 120, provided in the first reticle pod segment 102 and the second reticle pod segment 104. When a reticle 126 is located in the reticle accommodation space 128, the reticle 126 can be surrounded by the first reticle pod segment 102 and the second reticle pod segment 104, optionally aside from gap 130 or another purge gas flow path.

Gap 130 can be formed between the first reticle pod segment 102 and the second reticle pod segment 104 when the reticle 126 is located in the reticle accommodation space 128. The gap 130 can form at least part of a purge gas flow path allowing a supply of purge gas to enter the reticle accommodation space 128, pass over surfaces of the reticle 126, and exit the reticle accommodation space 128. The purge gas can be, for example, nitrogen or any other suitable gas for purging contaminants from the reticle accommodation space 128. The purge gas can be supplied from any suitable source, such as a purge gas source connected to a reticle storage system containing the reticle pod 100. In an embodiment, the gap 130 can be formed by the thickness of the reticle 126 and the thickness of the reticle contacts such as reticle contact 120, such that the gap exists when the reticle 126 is clamped by the reticle contacts such as reticle contact 120. In an embodiment, the gap 130 is formed between the first reticle pod segment 102 and the second reticle pod segment 104 only when the reticle 126 is located within the reticle accommodation space 128. In an embodiment, the width of the gap 130 can be between 0.5 millimeters (mm) and 6 mm. In an embodiment, the width of the gap 130 can be between 1.0 mm and 3 mm. In an embodiment, the width of the gap 130 can be between 1.0 mm and 1.5 mm. It is understood that the width of the gap 130 can be selected based on desired flow characteristics for purge gas through the reticle pod 100.

Figure 2:
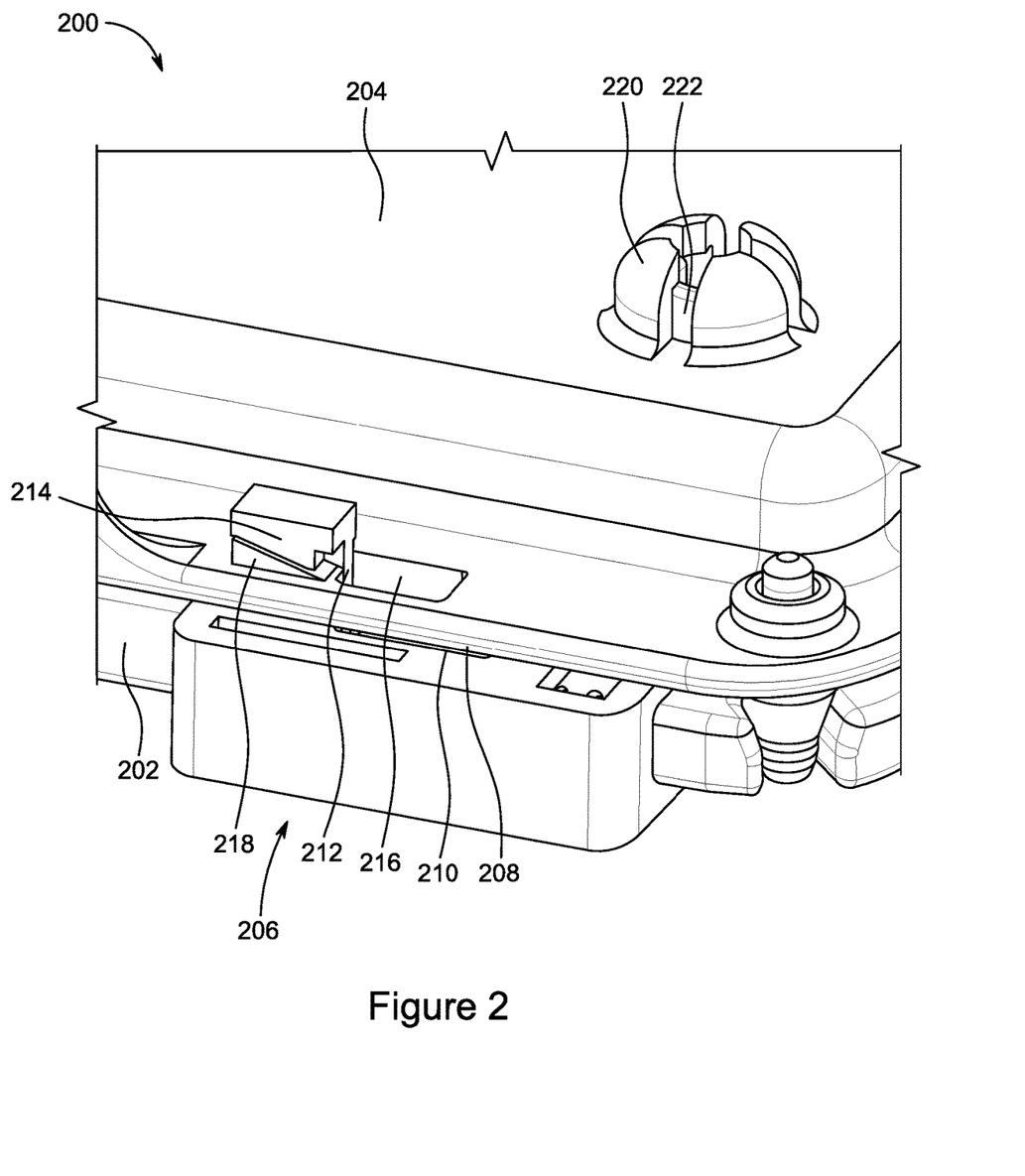
FIG. 2 shows a perspective view of a reticle pod according to an embodiment.

FIG. 2 shows a perspective view of a reticle pod according to an embodiment. Reticle pod 200 includes first reticle pod segment 202 and second reticle pod segment 204. First reticle pod segment 202 includes latch 206. Latch 206 includes a channel (not shown), a latch main body 208, a slot 210, a flange 212 projecting through slot 210, and first interface surface 214 disposed on flange 212. Second reticle pod segment 204 includes opening 216 and second interface surface 218. Second reticle pod segment 204 also includes boss 220 and reticle contact 222.

Reticle pod 200 is a pod configured to accommodate a reticle, for example reticle 126 as discussed above and shown in FIG. 1. The reticle pod 200 can be used for transportation and/or storage of the reticle. In an embodiment, reticle pod 200 is a stocker pod configured for the transportation and storage of the reticle.

First reticle pod segment 202 forms a portion of reticle pod 200. In the embodiment shown in FIG. 2, first reticle pod segment 202 forms a baseplate of the reticle pod 200. In another embodiment, first reticle pod segment 202 can be a cover of the reticle pod 200. First reticle pod segment 202 includes latch 206. Latch 206 provides a mechanism to bring first interface surface 214 into contact with second interface surface 218. Latch 206 includes a channel (not shown) formed in the first reticle pod segment. Latch main body 208 can be primarily disposed in the channel. Latch main body 208 can be contacted by a spring (not shown) such as the spring 110 described above and shown in FIG. 1. The latch main body 208 includes a flange 212. A slot 210 can be formed in the first reticle pod segment 202, the slot 210 configured to allow the flange 212 to extend out of the channel. The flange 212 can extend towards the second reticle pod segment 204 when reticle pod 200 is assembled. While one latch 206 is shown in the portion of reticle pod 200 shown in FIG. 2, it is understood that a plurality of latches 206 and corresponding openings 216 and second interface surfaces 218 can be provided on reticle pod 200. First interface surface 214 is provided on flange 212. In an embodiment, the first interface surfaces 214 are ramped surfaces, for example as shown in FIG. 2. In an embodiment, the first interface surfaces 214 can have a shape other than a ramped surface, for example, a flat surface, a rounded surface, a pin, or the like, when the second interface surfaces 218 are ramped surfaces. In an embodiment, the first interface surfaces 214 and the second interface surfaces 218 are each complementary ramped surfaces. The contact of the first interface surface 214 and the second interface surface 218 can provide force pushing first reticle pod segment 202 and second reticle pod segment 204 towards one another, providing clamping force to a reticle contained within reticle pod 200.

Second reticle pod segment 204 is another component of the reticle pod 200, configured to be joined to first reticle pod segment 202. In an embodiment such as the embodiment shown in FIG. 2, second reticle pod segment 204 forms a cover of the reticle pod 200. In another embodiment, the second reticle pod segment 204 forms a baseplate of the reticle pod 200. Second reticle pod segment 204 includes opening 216. While one opening 216 is shown, it is understood that an opening 216 can be provided for each latch 206 included in first reticle pod segment 202. The opening 216 is an opening through the second reticle pod segment 204 sized and positioned such that the first interface surface 214 and a portion of flange 212 can pass through the opening 216 when the latch 206 is in the unlatching position and when the first and second reticle pod segments 202, 204 are brought together. The opening 216 can be positioned such that when the latch 206 is moved to the latching position, the first interface surface 214 can contact second interface surface 218. Such a position of opening 216 can be adjacent to or proximate to the second interface surface 218. Second interface surface 218 is an interface surface that is configured to contact the first interface surface 214. In an embodiment, the second interface surfaces 218 can have a shape other than a ramped surface, for example, a flat surface, a rounded surface, a pin, or the like, when the first interface surfaces 214 are ramped surfaces. In an embodiment, the first interface surfaces 214 and the second interface surfaces 218 are each complementary ramped surfaces. When first interface surfaces 214 and second interface surfaces 218 contact one another, the ramped surface of either or both of first interface surfaces 214 or second interface surfaces 218 can provide clamping force for clamping a reticle within reticle pod 200 and retaining first reticle pod segment 202 to second reticle pod segment 204.

As shown in the embodiment of FIG. 2, the second reticle pod segment 204 can include boss 220. Boss 220 can be used to retain reticle contact 222. Reticle contact 222 is configured to contact a reticle held within reticle pod 200. The reticle contact 222 can be made of any suitable material for contacting the reticle. In an embodiment, the reticle contact 222 includes a PEEK material, such as a pure PEEK material or a filled PEEK material. The reticle contact 222 can be retained in reticle pod 200 by any suitable mechanical connection for retaining the reticle contact 222 within the reticle pod 200. In the embodiment shown in FIG. 2, the boss 220 includes a channel into which the reticle contact 222 can be press-fit. In an embodiment, boss 220 can be omitted from reticle pod 200 with the reticle contact 222 being secured by any other suitable mechanical connection, with one non-limiting example being the reticle contact 222 being press-fit into a channel formed in or drilled through part of the reticle pod 200, such as the second retile pod segment 204. While only one boss 220 and reticle contact 222 are shown in FIG. 2, it is understood that the second reticle pod segment 204 can include a plurality of bosses 220 and/or reticle contacts 222. Reticle contacts 222 can also be provided on first reticle pod segment 202. In an embodiment, reticle contacts 222 can be provided in corresponding positions on the first reticle pod segment 202 and the second reticle pod segment 204 such that the reticle is clamped between reticle contacts 222 when reticle pod 200 is assembled with a reticle contained within.

Figure 3:
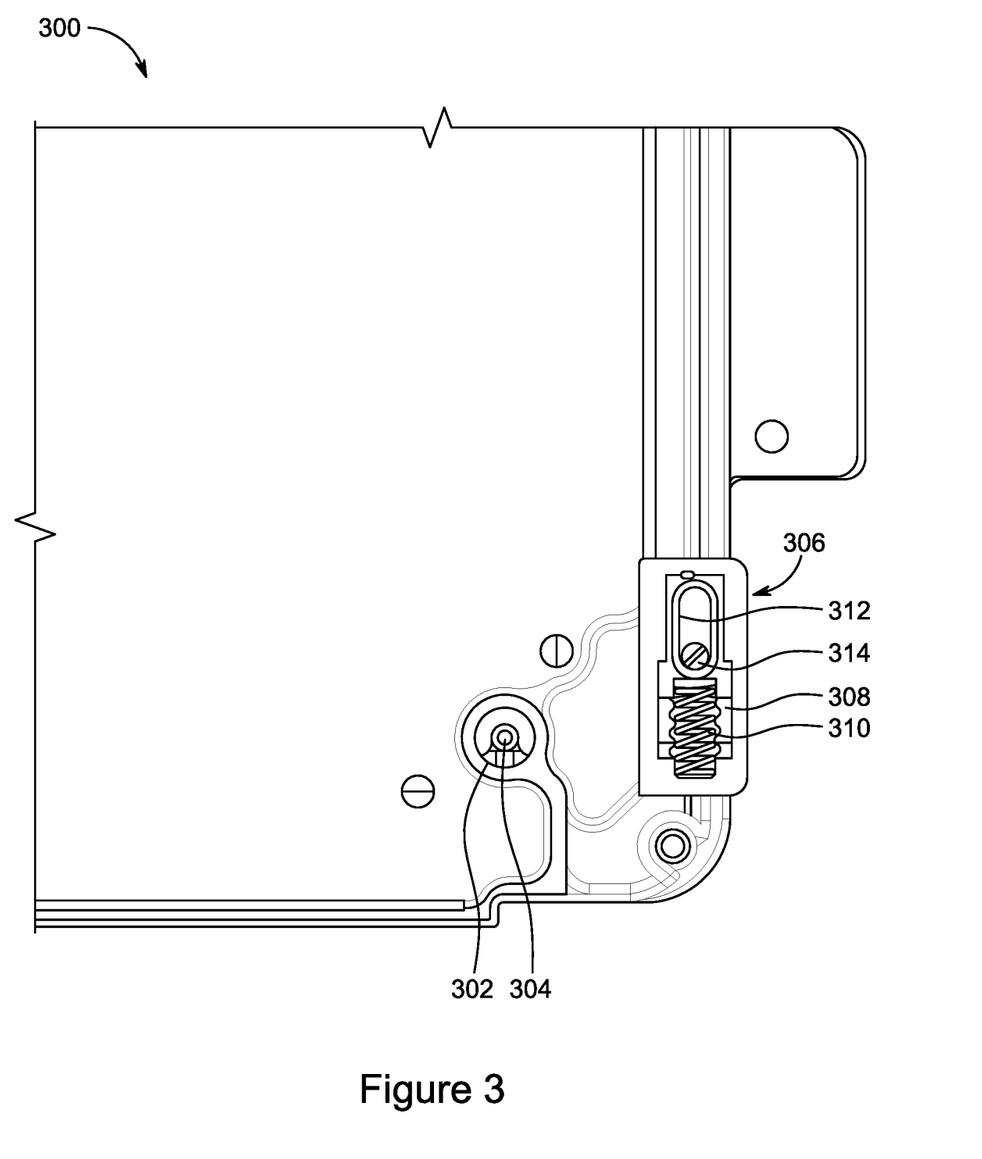
FIG. 3 shows a bottom view of a reticle pod according to an embodiment.

FIG. 3 shows a bottom view of a reticle pod according to an embodiment. In the bottom view of FIG. 3, the first reticle pod segment 300 can be seen. The first reticle pod segment 300 includes a boss 302 and a reticle contact 304. The first reticle pod segment 300 also includes a latch 306, which includes a channel 308, a spring 310, and a latch main body 312. Latch main body 312 can include a manipulation feature 314.

First reticle pod segment 300 can be part of a reticle pod 100 or reticle pod 200 as discussed above and shown in FIGS. 1 and 2. In particular, first reticle pod segment 300 can be included in the reticle pod 100 or the reticle pod 200 as the first reticle pod segment 102 or the first reticle pod segment 202. In the embodiment shown in FIG. 3, first reticle pod segment 300 forms a bottom of a reticle pod such as reticle pod 100 or reticle pod 200 as discussed above and shown in FIGS. 1 and 2.

Boss 302 is configured to retain reticle contact 304. Reticle contact 304 can be retained in boss 302 through any suitable features for forming a mechanical connection. As a non-limiting example, the mechanical connection can be a press-fit of reticle contact 304 within boss 302. Reticle contact 304 is configured to contact a reticle, such as reticle 126 described above and shown in FIG. 1. The reticle can be clamped between the reticle contact 304 and reticle contacts provided on the second reticle pod segment, such as reticle contact 120 as discussed above and shown in FIG. 1. In an embodiment, instead of bosses 302, the reticle contacts 304 can be contained within features formed in the first reticle pod segment 300, such as drilled holes or the like. While the section of first reticle pod segment 300 includes one boss 302 and reticle contact 304, it is understood that a plurality of bosses 302 and reticle contacts 304 can be included in first reticle pod segments such as first reticle pod segment 300. In an embodiment, the reticle contact 304 is formed of or includes any suitable material for contacting the reticle, such as a PEEK material including pure or filled PEEK.

Latch 306 is provided on first reticle pod segment 300. Latch 306 can be configured to provide an interface surface such as first interface surface 116 described above and shown in FIG. 1 such that it can contact a second interface surface provided on a second reticle pod segment (not shown), such as second interface surface 122 of second reticle pod segment 104 as described above and shown in FIG. 1. Latch 306 can include a channel 308, spring 310, and latch main body 312.

Channel 308 is a channel formed in the first reticle pod segment 300. Channel 308 is sized such that latch main body 312 can be retained within the channel 308 and slid along channel 308.

Spring 310 can be disposed in the channel 308, contacting an end of channel 308 and the latch main body 312, such that the spring 310 can drive the latch main body 312 along the channel 308. Latch main body 312 can be sized to at least partially be located within channel 308, such that the latch main body 312 can be slid along the channel 308 between a latching position and an unlatching position. The latch main body 312 can include an interface surface (not shown) such as first interface surface 116 described above and shown in FIG. 1. In an embodiment, the latch main body 312 can include a flange such as flange 114 described above and shown in FIG. 1.

Manipulation feature 314 can be formed in latch main body 312 to allow mechanical interface with the latch main body 312 such that latch main body 312 can be moved, for example into the unlatching position. In an embodiment, the manipulation feature 314 can be a projection from the latch main body such as a peg, post, or the like. In an embodiment, the manipulation feature 314 can be a recess formed in the latch main body 312, such as a drilled opening. The manipulation feature can engage with a portion of an operation automation device (not shown) such as features at or near a load port. The operation automation device can move the latch main body 312 into a suitable position for assembling or opening the reticle pod including first reticle pod segment 300. For example, the operation automation device can move the latch main body into the unlatching position to allow the assembly or opening of the reticle pod.

Figure 4:
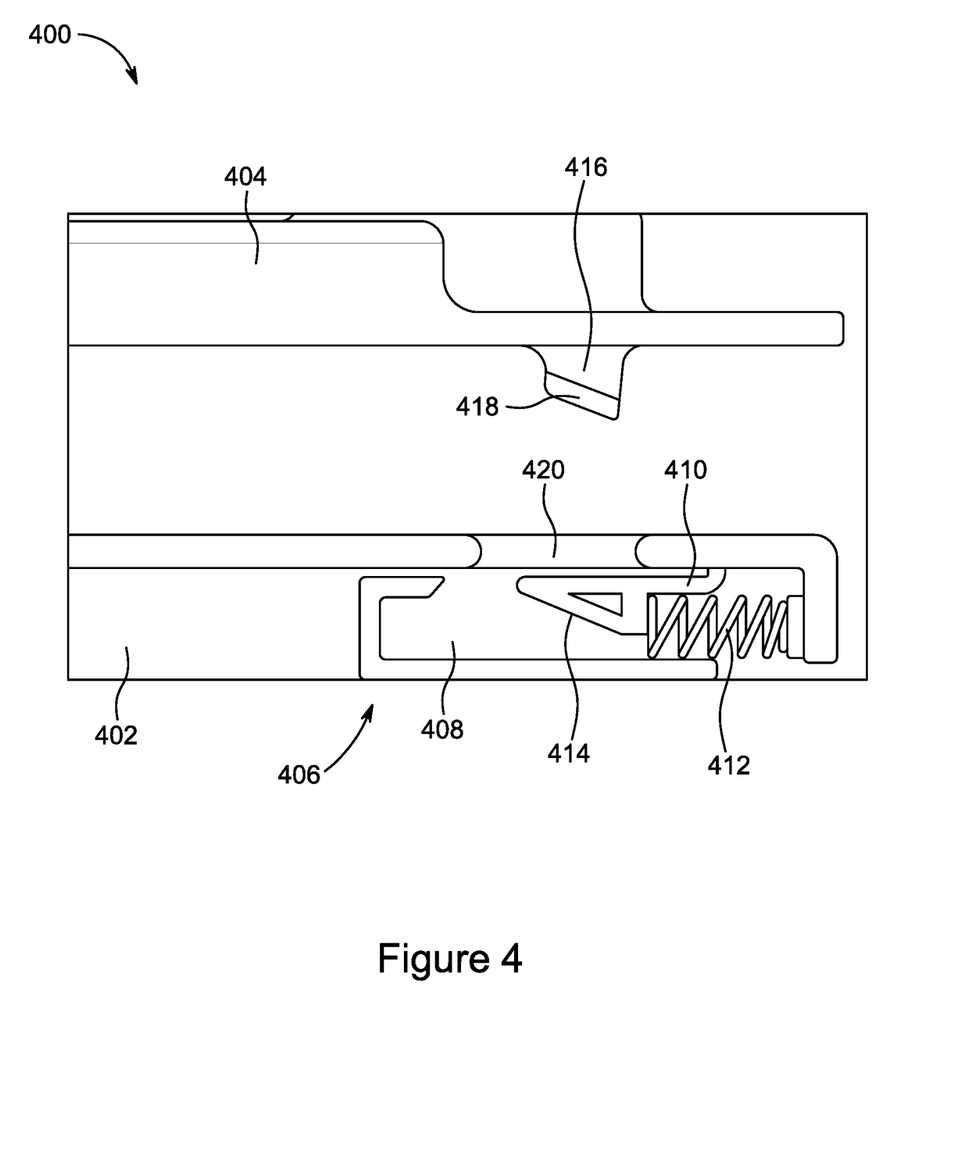
FIG. 4 shows a side view of a reticle pod according to an embodiment.

FIG. 4 shows a side view of a reticle pod according to an embodiment. Reticle pod 400 includes first reticle pod segment 402 and second reticle pod segment 404. First reticle pod segment 402 includes latch 406, which includes channel 408, latch main body 410, and spring 412. First interface surface 414 is provided on latch main body 410. Second reticle pod segment includes flange 416 and second interface surface 418 provided on the flange 416. Latch 406 further includes an opening 420.

Reticle pod 400 is a pod configured to accommodate a reticle. The reticle pod 400 can be a stocker pod for storage and/or transportation of reticles. In an embodiment, reticle pod 400 can provide a purge gas flow path, for example a gap such as gap 130 as described above and shown in FIG. 1.

First reticle pod segment 402 is one portion of reticle pod 400. In an embodiment, such as the embodiment shown in FIG. 4, first reticle pod segment 402 serves as a baseplate of the reticle pod 400. In another embodiment, the first reticle pod segment 402 serves as a cover of the reticle pod 400. First reticle pod segment includes latch 406. Latch 406 includes a channel 408, configured to accommodate latch main body 410. Latch main body 410 is contacted by spring 412, such that spring 412 can push latch main body 410 towards a latching position. In an embodiment, latch main body 410 can include a manipulation feature, such as the manipulation feature 314 discussed above and shown in FIG. 3. Latch main body 410 includes first interface surface 414. First interface surface 414 is a surface configured to contact second interface surface 418 to secure the reticle pod 400 together and clamp a reticle within the reticle pod 400. In an embodiment, first interface surface 414 is a ramped surface, as shown in FIG. 4. In an embodiment, when second interface surface 418 is a ramped surface, first interface surface can have any suitable shape for contacting the ramped surface of second interface surface 418, including a ramped surface, a flat surface, a curved surface, a pin, or the like. In reticle pod 400, at least one of first interface surface 414 or second interface surface 418 is a ramped surface. In an embodiment, for example as shown in FIG. 4, each of the first interface surface 414 and second interface surface 418 are ramped surfaces.

Second reticle pod segment 404 is another portion of reticle pod 400. In an embodiment, such as the embodiment shown in FIG. 4, second reticle pod segment 404 serves as a cover of the reticle pod 400. In another embodiment, the second reticle pod segment 404 serves as a baseplate of the reticle pod 400. Second reticle pod segment 404 include flange 416. Flange 416 projects from the second reticle pod segment 404 on a side of second reticle pod segment 404 that faces first reticle pod segment 402 when the reticle pod 400 is assembled. The flange 416 allows the second interface surface 418 to be provided in a position where it can be inserted into latch 406 when the second reticle pod segment 404 is joined to the first reticle pod segment 402. Second interface surface 418 is a surface configured to contact the first interface surface 414. In an embodiment, second interface surface 418 is a ramped surface. In an embodiment, where first interface surface 414 is a ramped surface, second interface surface can have any suitable shape for contacting the ramped surface of first interface surface 414, including a ramped surface, a flat surface, a curved surface, a pin, or the like. In reticle pod 400, at least one of first interface surface 414 or second interface surface 418 is a ramped surface. In an embodiment, for example as shown in FIG. 4, each of the first interface surface 414 and second interface surface 418 are ramped surfaces. While FIG. 4 shows one set of first interface surface 414 and second interface surface 418, it is understood that multiple sets of corresponding first interface surfaces 414 and second interface surfaces 418 can be provided on reticle pod 400, for example being distributed around a perimeter or along particular sides of the first and second reticle pod segments 402, 404.

Opening 420 is an opening allowing second interface surface 418 and at least a portion of flange 416 to be inserted into channel 408 such that the first interface surface 414 can be brought into contact with the second interface surface 418. To close and latch the reticle pod, the latch main body 410 is moved to an unlatching position, the second interface surface 418 is inserted into opening 420, and the latch main body 410 is released such that spring 412 can drive the latch main body 410 along channel 408. The first interface surface 414 and second interface surface 418 engage with one another, with the ramped surface of at least one of first interface surface 414 or second interface surface 418 providing force clamping the first reticle pod segment 402 and the second reticle pod segment 404 together.

Figure 5:
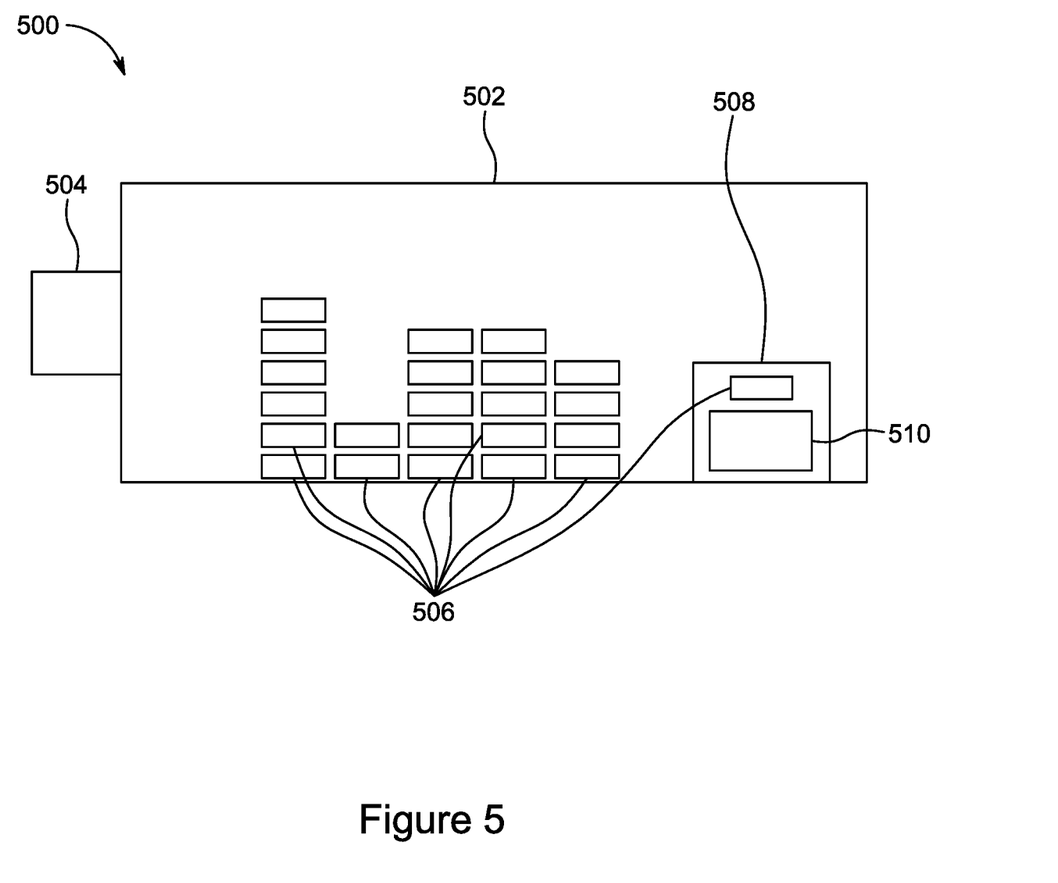
FIG. 5 shows a schematic of a reticle storage system according to an embodiment.

FIG. 5 shows a schematic of a reticle storage system according to an embodiment. Reticle storage system 500 includes a stocker pod container 502, a purge gas source 504, and a plurality of reticle pods 506. Optionally, reticle storage system 500 can further include reticle transfer automation 508.

Reticle storage system 500 can be used to store reticles, for example following processing such as photolithography. A non-limiting example of processing that can be performed on reticles that have been or will be stored in reticle storage system 500 includes EUV processing. The reticle storage system includes a stocker pod container. The stocker pod container 502 is sized such that it can accommodate a plurality of reticle pods 506. The stocker pod container 502 can be configured such that it is sealed during at least a portion of the storage of reticles within the reticle storage system 500. In an embodiment, a purge gas source 504 can be connected to the stocker pod container 502. The purge gas source 504 can be configured to supply purge gas to an interior of the stocker pod container. The purge gas source 504 can be any suitable gas for purging oxygen, moisture, particulate matter, any other contaminants, or the like from the stocker pod container by driving out such contaminants. As a non-limiting example, the purge gas can be nitrogen gas. The purge gas source 504 can be, as non-limiting examples, a tank containing the purge gas, a connection to a purge system of a semiconductor fabrication operation, or the like.

The reticle storage system 500 includes a plurality of reticle pods 506. The reticle pods 506 can be according to any of the embodiments of reticle pods 506 described herein. The reticle pods 506 each can be used to store one reticle.

In an embodiment, reticle transfer automation 508 can be included in the reticle storage system 500. In an embodiment, reticle transfer automation 508 is located within the stocker pod container 502. The reticle transfer automation 508 can be configured to interface with the reticle pods 506, for example at features such as manipulation features 314 as described above and shown in FIG. 3 to open and close the reticle pods. The reticle transfer automation 508 can further be configured to receive a reticle pod 510, such as an EUV pod, and transfer a reticle from the reticle pod 510 to a reticle pod 506 or vice versa. In an embodiment, the reticle pod 510 can be a full reticle pod including an outer pod and an inner pod. In an embodiment, the reticle pod 510 can be only an inner pod. In an embodiment, the reticle transfer automation 508 can be configured to retrieve a reticle pod 506 from within the stocker pod container 502.

Figure 6:
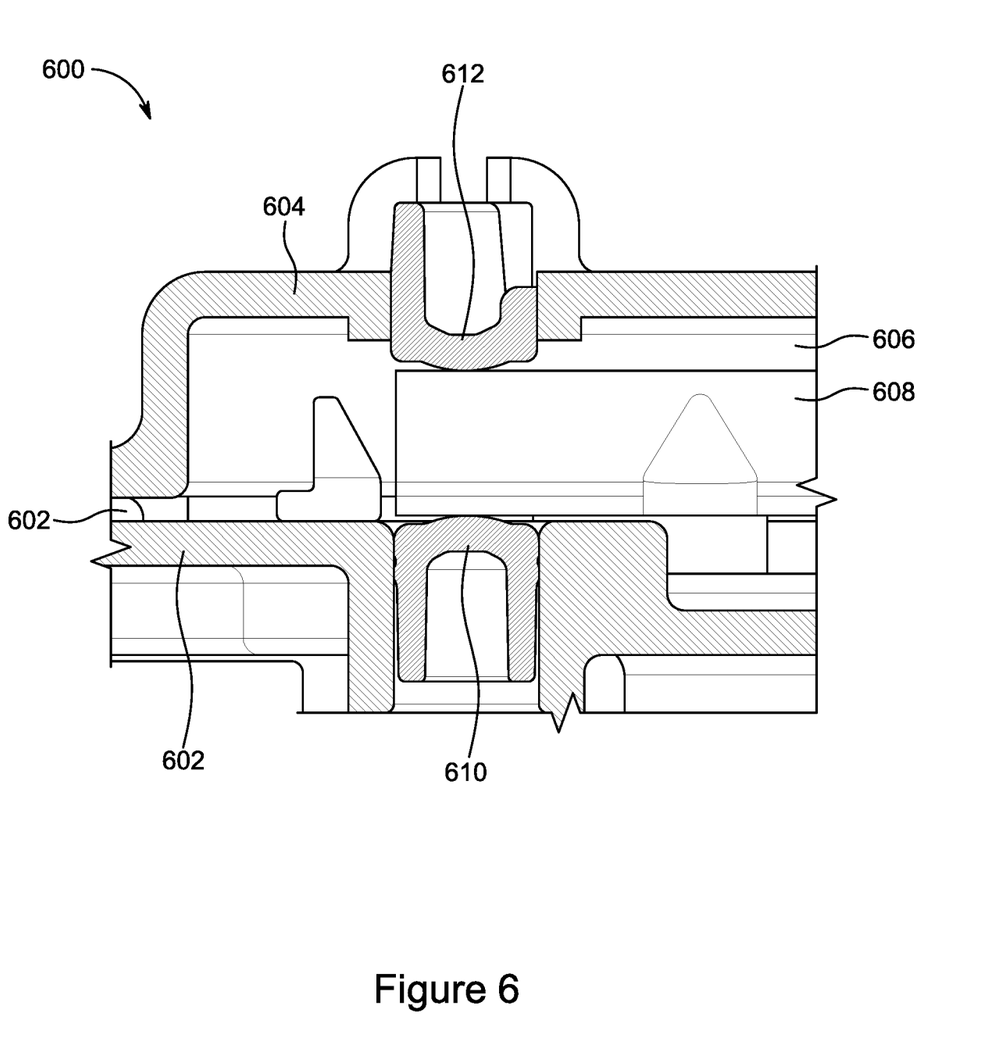
FIG. 6 shows a sectional view of a reticle pod according to an embodiment.

FIG. 6 shows a sectional view of a reticle pod according to an embodiment. Reticle pod 600 includes first reticle pod segment 602 and second reticle pod segment 604. The first reticle pod segment 602 and the second reticle pod segment 604 define reticle accommodation space 606. A reticle 608 can be retained in the reticle accommodation space 606. The reticle 608 can be held in place by clamping between first reticle contacts 610 provided on the first reticle pod segment 602 and second reticle contacts 612 provided on the second reticle pod segment 604. The first reticle contacts 610 and the second reticle contacts 612 can be driven towards one another by the interface of first and second interface surfaces (not shown) provided on first reticle pod segment 602 and second reticle pod segment 604. The first and second interface surfaces can be any of the corresponding first and second interface surfaces described above and shown in FIGS. 1-4. The driving together of the reticle contacts 610, 612 can clamp the reticle 608. In an embodiment, the first reticle contacts 610 and second reticle contacts 612 can be sized and/or positioned such that when the reticle 608 is clamped between first reticle contacts 610 and second reticle contacts 612, gap 614 is formed between the first reticle pod segment 602 and second reticle pod segment 604.

Aspects:

It is understood that any of aspects 1-15 can be combined with any of aspects 16-18 or 19. It is understood that any of aspects 16-18 can be combined with aspect 19.

Aspect 1. An article, comprising:
a reticle pod, the reticle pod including:
a first reticle pod segment, including a plurality of first reticle contacts and a plurality of latches, each of the plurality of latches including a first interface surface; and
a second reticle pod segment, including a plurality of second reticle contacts and a plurality of second interface surfaces;
wherein each of the first interface surfaces of the plurality of latches is configured to contact one of the plurality of second interface surfaces when the first interface surfaces are in a latching position;
one or both of the first interface surfaces and the second interface surfaces are ramped surfaces;
the reticle pod is configured to accommodate a reticle in a reticle accommodation space such that when the reticle is within the reticle accommodation space and the first interface surfaces contact the second interface surfaces, the reticle is clamped by the plurality of first reticle contacts and the plurality of second reticle contacts.

Aspect 2. The article according to aspect 1, wherein when the reticle is contacted by the plurality of first reticle contacts and the plurality of second reticle contacts, the reticle pod defines a purge gas flow path from an exterior of the reticle pad through the reticle space.

Aspect 3. The article according to aspect 2, wherein the purge gas flow path is formed by a gap between the first reticle pod segment and the second reticle pod segment.

Aspect 4. The article according to aspect 3, wherein the gap is in the range from 0.5 to 6 millimeters (mm).

Aspect 5. The article according to any of aspects 3-4 wherein the gap is formed by heights of each of the plurality of first reticle contacts and the plurality of second reticle contacts and a thickness of the reticle.

Aspect 6. The article according to any of aspects 1-5, wherein at least one of the first reticle pod segment and the second reticle pod segment includes a plurality of reticle contact bosses, and wherein at least some of the first plurality of reticle contacts or at least some of the second plurality of reticle contacts are partially disposed in the plurality of reticle contact bosses.

Aspect 7. The article according to any of aspects 1-6, wherein the plurality of first reticle contacts and the plurality of second reticle contacts include a polyether ether ketone (PEEK) material.

Aspect 8. The article according to any of aspects 1-7 wherein at least one of the first reticle pod segment and the second reticle pod segment includes aluminum.

Aspect 9. The article according to any of aspects 1-8, wherein both the first interface surfaces and the second interface surfaces are ramped surfaces.

Aspect 10. The article according to any of aspects 1-9, wherein each of the second interface surfaces is disposed on an outer surface of the second reticle pod segment.

Aspect 11. The article according to aspect 10, wherein an opening is provided on the second reticle pod segment, the opening configured to allow a portion of the latching member body including the first interface surface to pass through said opening, and wherein the opening is positioned adjacent to each of the second interface surfaces.

Aspect 12. The article according to any of aspects 1-11, wherein each of the second interface surfaces is disposed on a flange, each flange projecting towards the first reticle pod segment when the reticle pod is assembled.

Aspect 13. The article according to any of aspects 1-12, wherein each of the latches includes:
a channel;
a latching member body configured to be movable within the channel, the latching member body including one of the plurality of first interface surfaces; and
a spring, the spring configured to drive the latching member body along the channel such that the latching member body is driven towards the latching position.

Aspect 14. The article according to aspect 13, wherein an angle of each of the first interface surfaces and each of the second interface surfaces and a coefficient of friction of each of the first interface surfaces and each of the second interface surfaces are selected such that the latch main body resists backing out of the latching position when the first interface surfaces contact the second interface surfaces.

Aspect 15. The article according to any of aspects 13-14, wherein an angle of each of the first interface surfaces and each of the second interface surfaces is 30° or less.

Aspect 16. A method of storing a reticle, comprising placing the reticle into a reticle pod, wherein the reticle pod includes:
a first reticle pod segment, including a plurality of first reticle contacts and a plurality of latches, each of the plurality of latches including a first interface surface; and
a second reticle pod segment, including a plurality of second reticle contacts and a plurality of second interface surfaces;
wherein each of the first interface surfaces of the plurality of latches is configured to contact one of the plurality of second interface surfaces when the first interface surfaces are in a latching position;
one or both of the first interface surfaces and the second interface surfaces are ramped surfaces;
the reticle pod is configured to accommodate a reticle in a reticle accommodation space such that when the reticle is within the reticle accommodation space and the first interface surfaces contact the second interface surfaces, the reticle is clamped by the plurality of first reticle contacts and the plurality of second reticle contacts.

Aspect 17. The method according to aspect 16, wherein when the reticle is contacted by the plurality of first reticle contacts and the plurality of second reticle contacts, the reticle pod defines a purge gas flow path from an exterior of the reticle pad through the reticle space, and wherein the method further comprises providing a purge gas flow through the purge gas flow path.

Aspect 18. The method according to any of aspects 16-17, wherein each of the latches includes:
a channel;
a latching member body configured to be movable within the channel, the latching member body including one of the plurality of first interface surfaces; and
a spring, the spring configured to drive the latching member body along the channel such that the latching member body is driven towards the latching position; and
wherein placing the reticle into the article includes:
drawing each of the latching member bodies into an unlatching position;
bringing the first reticle pod segment and the second reticle pod segment together such that the reticle is contacted by the plurality of first reticle contacts and the plurality of second reticle contacts; and
releasing each of the latching member bodies such that the springs can drive the latching member bodies to the latching position.

Aspect 19. A reticle storage system, including:
a pod container;
a purge gas supply; and
a plurality of reticle pods each configured to be contained within the pod container, each reticle pod including:
a first reticle pod segment, including a plurality of first reticle contacts and a plurality of latches, each of the plurality of latches including a first interface surface; and
a second reticle pod segment, including a plurality of second reticle contacts and a plurality of second interface surfaces;
wherein each of the first interface surfaces of the plurality of latches is configured to contact one of the plurality of second interface surfaces when the first interface surfaces are in a latching position;
one or both of the first interface surfaces and the second interface surfaces are ramped surfaces;
the reticle pod is configured to accommodate a reticle in a reticle accommodation space such that when the reticle is within the reticle accommodation space and the first interface surfaces contact the second interface surfaces, the reticle is clamped by the plurality of first reticle contacts and the plurality of second reticle contacts.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. An article, comprising:
a reticle pod, the reticle pod including:
a first reticle pod segment, including a plurality of first reticle contacts and a plurality of latches, each of the plurality of latches including a first interface surface; and
a second reticle pod segment, including a plurality of second reticle contacts and a plurality of second interface surfaces;
wherein each of the first interface surfaces of the plurality of latches is configured to contact one of the plurality of second interface surfaces when the first interface surfaces are in a latching position;
one or both of the first interface surfaces and the second interface surfaces are ramped surfaces;
the reticle pod is configured to accommodate a reticle in a reticle accommodation space such that when the reticle is within the reticle accommodation space and the first interface surfaces contact the second interface surfaces, the reticle is clamped by the plurality of first reticle contacts and the plurality of second reticle contacts
wherein when the reticle is contacted by the plurality of first reticle contacts and the plurality of second reticle contacts, the reticle pod defines a purge gas flow path from an exterior of the reticle pod through the reticle space.

2. The article of claim 1, wherein the purge gas flow path is formed by a gap between the first reticle pod segment and the second reticle pod segment.

3. The article of claim 2, wherein the gap is in the range from 0.5 to 6 millimeters (mm).

4. The article of claim 2, wherein the gap is formed by heights of each of the plurality of first reticle contacts and the plurality of second reticle contacts and a thickness of the reticle.

5. The article of claim 1, wherein at least one of the first reticle pod segment and the second reticle pod segment includes a plurality of reticle contact bosses, and wherein at least some of the first plurality of reticle contacts or at least some of the second plurality of reticle contacts are partially disposed in the plurality of reticle contact bosses.

6. The article of claim 1, wherein the plurality of first reticle contacts and the plurality of second reticle contacts include a polyether ether ketone (PEEK) material.

7. The article of claim 1, wherein at least one of the first reticle pod segment and the second reticle pod segment includes aluminum.

8. The article of claim 1, wherein both the first interface surfaces and the second interface surfaces are ramped surfaces.

9. The article of claim 1, wherein each of the second interface surfaces is disposed on an outer surface of the second reticle pod segment.

10. The article of claim 9, wherein an opening is provided on the second reticle pod segment, the opening configured to allow a portion of the latching member body including the first interface surface to pass through said opening, and wherein the opening is positioned adjacent to each of the second interface surfaces.

11. The article of claim 1, wherein each of the second interface surfaces is disposed on a flange, each flange projecting towards the first reticle pod segment when the reticle pod is assembled.

12. The article of claim 1, wherein each of the latches includes:
a channel;
a latching member body configured to be movable within the channel, the latching member body including one of the plurality of first interface surfaces; and
a spring, the spring configured to drive the latching member body along the channel such that the latching member body is driven towards the latching position.

13. The article of claim 12, wherein an angle of each of the first interface surfaces and each of the second interface surfaces and a coefficient of friction of each of the first interface surfaces and each of the second interface surfaces are selected such that the latch main body resists backing out of the latching position when the first interface surfaces contact the second interface surfaces.

14. The article of claim 12, wherein an angle of each of the first interface surfaces and each of the second interface surfaces is 30° or less.

15. A method of storing a reticle, comprising placing the reticle into a reticle pod, wherein the reticle pod includes:
- a first reticle pod segment, including a plurality of first reticle contacts and a plurality of latches, each of the plurality of latches including a first interface surface; and
- a second reticle pod segment, including a plurality of second reticle contacts and a plurality of second interface surfaces;
- wherein each of the first interface surfaces of the plurality of latches is configured to contact one of the plurality of second interface surfaces when the first interface surfaces are in a latching position;
- one or both of the first interface surfaces and the second interface surfaces are ramped surfaces;
- the reticle pod is configured to accommodate a reticle in a reticle accommodation space such that when the reticle is within the reticle accommodation space and the first interface surfaces contact the second interface surfaces, the reticle is clamped by the plurality of first reticle contacts and the plurality of second reticle contacts
- wherein when the reticle is contacted by the plurality of first reticle contacts and the plurality of second reticle contacts, the reticle pod defines a purge gas flow path from an exterior of the reticle pod through the reticle space.

16. The method of claim 15, wherein when the reticle is contacted by the plurality of first reticle contacts and the plurality of second reticle contacts, the reticle pod defines a purge gas flow path from an exterior of the reticle pad through the reticle space, and wherein the method further comprises providing a purge gas flow through the purge gas flow path.

17. The method of claim 16, wherein each of the latches includes:
- a channel;
- a latching member body configured to be movable within the channel, the latching member body including one of the plurality of first interface surfaces; and
- a spring, the spring configured to drive the latching member body along the channel such that the latching member body is driven towards the latching position; and wherein placing the reticle into the article includes:
drawing each of the latching member bodies into an unlatching position;
bringing the first reticle pod segment and the second reticle pod segment together such that the reticle is contacted by the plurality of first reticle contacts and the plurality of second reticle contacts; and
releasing each of the latching member bodies such that the springs can drive the latching member bodies to the latching position.

18. A reticle storage system, including:
a pod container;
a purge gas supply; and
a plurality of reticle pods each configured to be contained within the pod container, each reticle pod including:
a first reticle pod segment, including a plurality of first reticle contacts and a plurality of latches, each of the plurality of latches including a first interface surface; and
a second reticle pod segment, including a plurality of second reticle contacts and a plurality of second interface surfaces;
wherein each of the first interface surfaces of the plurality of latches is configured to contact one of the plurality of second interface surfaces when the first interface surfaces are in a latching position;
one or both of the first interface surfaces and the second interface surfaces are ramped surfaces;
the reticle pod is configured to accommodate a reticle in a reticle accommodation space such that when the reticle is within the reticle accommodation space and the first interface surfaces contact the second interface surfaces, the reticle is clamped by the plurality of first reticle contacts and the plurality of second reticle contacts.

* * * * *